United States Patent
Udagawa

(10) Patent No.: US 7,732,832 B2
(45) Date of Patent: Jun. 8, 2010

(54) COMPOUND SEMICONDUCTOR LIGHT-EMITTING DEVICE INCLUDING P-TYPE UNDOPED BORON-PHOSPHIDE-BASED SEMICONDUCTOR LAYER JOINED TO THIN-FILM LAYER COMPOSED OF AN UNDOPED HEXAGONAL GROUP III NITRIDE SEMICONDUCTOR

(75) Inventor: Takashi Udagawa, Chichibu (JP)

(73) Assignee: Showa Denko K.K., Tokyo (JP)

(*) Notice: Subject to any disclaimer, the term of this patent is extended or adjusted under 35 U.S.C. 154(b) by 715 days.

(21) Appl. No.: 11/587,662

(22) PCT Filed: Apr. 27, 2005

(86) PCT No.: PCT/JP2005/008459

§ 371 (c)(1),
(2), (4) Date: Oct. 26, 2006

(87) PCT Pub. No.: WO2005/106980

PCT Pub. Date: Nov. 10, 2005

(65) Prior Publication Data

US 2007/0221946 A1 Sep. 27, 2007

Related U.S. Application Data

(60) Provisional application No. 60/569,649, filed on May 11, 2004.

(30) Foreign Application Priority Data

Apr. 28, 2004 (JP) .............................. 2004-133515

(51) Int. Cl.
*H01L 33/00* (2006.01)

(52) U.S. Cl. ............................ 257/103; 257/94; 257/98; 257/99; 257/E33.025; 257/E33.034; 257/E33.045

(58) Field of Classification Search ................... 257/94, 257/98, 99, 103, E33.023, E33.025, E33.027, 257/E33.028, E33.03, E33.031, E33.033, 257/E33.034, E33.045
See application file for complete search history.

(56) References Cited

U.S. PATENT DOCUMENTS 3,022,452 A 2/1962 Williams et al.

(Continued)

FOREIGN PATENT DOCUMENTS

DE 1 162 486 2/1964

(Continued)

OTHER PUBLICATIONS

Machine Translation of JP 09-232685, Oba Yasuo, Sep. 5, 1997, "Semiconductor Light Emitting Device".*

(Continued)

*Primary Examiner*—Jerome Jackson, Jr.
*Assistant Examiner*—Jay C Kim
(74) *Attorney, Agent, or Firm*—Sughrue Mion, PLLC

(57) ABSTRACT

This pn-junction compound semiconductor light-emitting device includes a crystal substrate; an n-type light-emitting layer formed of a hexagonal n-type Group III nitride semiconductor and provided on the crystal substrate; a p-type Group III nitride semiconductor layer formed of a hexagonal p-type Group III nitride semiconductor and provided on the n-type light-emitting layer; a p-type boron-phosphide-based semiconductor layer having a sphalerite crystal type and provided on the p-type Group III nitride semiconductor layer; and a thin-film layer composed of an undoped hexagonal Group III nitride semiconductor formed on the p-type Group III nitride semiconductor layer, wherein the p-type boron-phosphide-based semiconductor layer is joined to the thin-film layer composed of an undoped hexagonal Group III nitride semiconductor.

2 Claims, 2 Drawing Sheets

U.S. PATENT DOCUMENTS

| | | | |
|---|---|---|---|
| 5,042,043 A | | 8/1991 | Hatano et al. |
| 5,076,860 A | | 12/1991 | Ohba et al. |
| 6,400,742 B1 | * | 6/2002 | Hatakoshi et al. ........ 372/46.01 |
| 6,711,191 B1 | * | 3/2004 | Kozaki et al. ............ 372/43.01 |
| 2003/0027099 A1 | * | 2/2003 | Udagawa ..................... 433/79 |

FOREIGN PATENT DOCUMENTS

| | | |
|---|---|---|
| JP | S49-19783 A | 2/1974 |
| JP | S55-3834 B2 | 1/1980 |
| JP | 2-275682 A | 11/1990 |
| JP | 2-288388 A | 11/1990 |
| JP | 6-283625 A | 10/1994 |
| JP | 6-283825 | 10/1994 |
| JP | 9-232685 | 9/1997 |
| JP | 2001-036196 A | 2/2001 |
| JP | 2002-232000 A | 8/2002 |
| JP | 2003-309284 A | 10/2003 |
| JP | 2006-24582 | 1/2006 |

OTHER PUBLICATIONS

Odawara et al., "Suppression of indium vaporization from GaN/GaInN superlattice by BP capping layer", Journal of Crystal Growth 263 (2004) pp. 645-647.*

Isamu Akasaki, "Group III-V Compound Semiconductors," 1994, 329-350, Chapter 13, Baifukan Co., Ltd., $1^{st}$ edition.

Y. Kumasiro et al., "Preparation and Electrical Properties of Boron and Boron Phosphide Films obtained by Gas Source Molecular Beam Deposition", Journal of Solid State Chem., vol. 133, pp. 269-272 (1997) SC977454.

* cited by examiner

COMPOUND SEMICONDUCTOR LIGHT-EMITTING DEVICE INCLUDING P-TYPE UNDOPED BORON-PHOSPHIDE-BASED SEMICONDUCTOR LAYER JOINED TO THIN-FILM LAYER COMPOSED OF AN UNDOPED HEXAGONAL GROUP III NITRIDE SEMICONDUCTOR

CROSS REFERENCE TO RELATED APPLICATIONS

The present application claims priority from Japanese patent application No. 2004-133515, filed on Apr. 28, 2004, and U.S. provisional application No. 60/569,649, filed on May 11, 2004, the contents of which are incorporated herein by reference.

TECHNICAL FIELD

The present invention relates to a technique for fabricating a pn-junction compound semiconductor light-emitting device exhibiting low forward voltage through employment of a low-resistive p-type boron-phosphide-based semiconductor layer.

BACKGROUND ART

Hitherto, a light-emitting diode (abbreviated as LED) and a laser diode (abbreviated as LD) having a Group III-V compound semiconductor (e.g., Group III nitride semiconductor) light-emitting layer containing a Group V constituent element such as nitrogen (symbol of element: N) are well known as light-emitting devices for principally emitting blue to green light (see, for example, Patent Document 1). Conventionally, such LEDs emitting short-wavelength visible light include a light-emitting layer generally composed of a gallium indium nitride mixed crystal (compositional formula: $Ga_Y In_Z N$: $0 \leq Y, Z \leq 1, Y+Z=1$) layer (see, for example, Patent Document 2).

(Patent Document 1)
Japanese Patent Application Laid-Open (kokai) No. 49-19783

(Patent Document 2)
Japanese Patent Publication (kokoku) No. 55-3834

(Patent Document 3)
Japanese Patent Application Laid-Open (kokai) No. 2-288388

(Patent Document 4)
Japanese Patent Application Laid-Open (kokai) No. 2-275682

(Non-Patent Document 1)
Book written and edited by Isamu AKASAKI, "Group III-V Compound Semiconductors," published Baifukan Co., Ltd., 1st edition, Chapter 13, (1995).

In general, an n-type light-emitting layer composed of a Group III nitride semiconductor is joined to form a heterojunction to a cladding layer for supplying carriers (electrons and holes) which cause radiation-recombination to emit light in the light-emitting layer (see, for example, Non-Patent Document 1). Conventionally, the p-type cladding layer for supplying holes to the light-emitting layer is generally composed of aluminum gallium nitride. ($Al_X Ga_Y N$: $0 \leq X, Y \leq 1$, $X+Y=1$) (see Non-Patent Document 1).

Another known technique for fabricating a light-emitting device includes providing, on a p-type $Al_X Ga_Y N$ ($0 \leq X, Y \leq 1$, $X+Y=1$) layer, a p-type boron phosphide (BP) layer serving as a contact layer for forming an Ohmic electrode thereon, the BP layer being doped with a p-type impurity element such as magnesium (symbol of element: Mg) (see, for example, Patent Document 3). For example, a laser diode (LD) is fabricated through provision of an Mg-doped p-type BP layer serving as a contact layer which is joined to a superlattice structure layer consisting of an Mg-doped boron phosphide layer of a zinc-blende structure and a $Ga_{0.4}Al_{0.6}N$ layer (see, for example, Patent Document 4).

Boron-phosphide-based semiconductor (typically boron phosphide) crystals generally have a crystal form of sphalerite. Since such cubic crystals have a degenerated valence band, a p-conduction-type crystal layer is readily formed as compared with a hexagonal crystal (Japanese Patent Application Laid-Open (kokai) No. 2-275682, see the aforementioned Patent Document 4). However, doping a boron-phosphide-based Group III-V compound semiconductor crystal layer with a Group II impurity element (e.g., Mg) does not always result in formation of a low-resistive p-type conductive layer having low and constant resistivity. Furthermore, Mg may serve as a donor impurity with respect to boron phosphide, and in some cases, a high-resistive or an n-conduction-type boron-phosphide-based semiconductor layer is formed through doping with Mg.

For example, in production of a stacked structure having a p-type BP layer provided on the Mg-doped p-type GaAlBNP Group III nitride semiconductor mixed crystal layer disclosed in Patent Document 3, a low-resistive p-type BP layer is not reliably formed even though the BP layer is intentionally doped with Mg. Therefore, pn-junction compound semiconductor light-emitting devices (such as LEDs) including a p-type boron-phosphide-based semiconductor layer fail to attain low forward voltage (Vf).

DISCLOSURE OF THE INVENTION

An object of the present invention is to provide, upon fabrication of a pn-junction compound semiconductor light-emitting device using a p-type boron-phosphide-based semiconductor layer formed on a conventional hexagonal Group III nitride semiconductor layer such as $Al_X Ga_Y N$ ($0 \leq X, Y \leq 1$, $X+Y=1$), a stacked structure for consistently providing a p-type boron-phosphide-based semiconductor layer having a high hole concentration (i.e., low resistance), thereby providing a light-emitting device such as an LED exhibiting low forward voltage.

In order to attain the aforementioned object, the present invention employs the following means.

(1) A pn-junction compound semiconductor light-emitting device includes a crystal substrate; an n-type light-emitting layer formed of a hexagonal n-type Group III nitride semiconductor and provided on the crystal substrate; a p-type layer formed of a hexagonal p-type Group III nitride semiconductor (p-type Group III nitride semiconductor layer) and provided on the n-type light-emitting layer; a p-type boron-phosphide (BP)-based semiconductor layer having a sphalerite crystal type and provided on the p-type Group III nitride semiconductor layer; and a thin-film layer composed of an undoped hexagonal Group III nitride semiconductor formed on the p-type Group III nitride semiconductor layer, wherein the p-type boron-phosphide (BP)-based semiconductor layer is joined to the thin-film layer composed of an undoped hexagonal Group III nitride semiconductor.

(2) A pn-junction compound semiconductor light-emitting device as described in (1) above, wherein the p-type Group III nitride semiconductor layer is formed from a wurtzite aluminum gallium nitride layer containing aluminum (symbol of element: Al) as an essential constituent element and having a composition represented by a compositional formula:

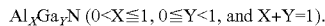
$Al_XGa_YN$ ($0<X\leq 1$, $0\leq Y<1$, and $X+Y=1$).

(3) A pn-junction compound semiconductor light-emitting device as described in (1) or (2) above, wherein the p-type boron-phosphide (BP)-based semiconductor layer provided on a surface of the p-type Group III nitride semiconductor layer is an undoped crystal layer.

(4) A pn-junction compound semiconductor light-emitting device as described in any one of (1) to (3) above, wherein the p-type Group III nitride semiconductor layer has a surface of a (0001) crystal plane, and the p-type boron-phosphide-based semiconductor layer provided on the surface is a (111) crystal layer having a [110] direction aligned with the a-axis of the (0001) crystal plane.

According to a first invention, in a pn-junction compound semiconductor light-emitting device including a p-type boron-phosphide-based semiconductor layer having a sphalerite crystal type, the p-type boron-phosphide-based semiconductor layer is joined to a thin-film layer composed of an undoped hexagonal Group III nitride semiconductor and formed on the p-type Group III nitride semiconductor layer serving as, for example, a p-type cladding layer. Thus, problematic failure to reliably form the p-type boron-phosphide-based semiconductor layer caused by thermal diffusion of the p-type impurity element added to the p-type Group III nitride semiconductor layer can be prevented, whereby a low-resistive p-type boron-phosphide-based semiconductor layer suitable for forming a p-type Ohmic electrode can be reliably formed. Therefore, a pn-junction compound semiconductor light-emitting diode exhibiting low forward voltage can be provided.

According to a second invention, the thin-film layer composed of a Group III nitride semiconductor is formed from a hexagonal wurtzite aluminum gallium nitride (compositional formula: $Al_XGa_YN$, $0<X\leq 1$, $0\leq Y<1$, and $X+Y=1$) layer containing aluminum as an essential constituent element. Thus, diffusion and migration of the p-type impurity element added to the p-type Group III nitride semiconductor layer to the p-type boron-phosphide-based semiconductor layer can be more reliably prevented, whereby a low-resistive p-type boron-phosphide-based semiconductor layer can be reliably formed. Therefore, a pn-junction compound semiconductor light-emitting diode exhibiting low forward voltage can be provided.

According to a third invention, the p-type boron-phosphide-based semiconductor layer provided on a surface of the thin-film layer composed of a Group III nitride semiconductor is formed from an undoped crystal layer. Thus, diffusion of the p-type impurity from the p-type boron-phosphide-based semiconductor layer to, for example, the light-emitting layer is reduced. Therefore, a pn-junction compound semiconductor light-emitting diode exhibiting small variation in emission wavelength can be provided.

According to a fourth invention, the p-type boron-phosphide-based semiconductor layer is provided on a (0001) crystal plane surface of the Group III nitride semiconductor thin-film layer, and formed from a (111) crystal layer having a [110] direction aligned with the a-axis of the (0001) crystal plane. Thus, a p-type boron-phosphide-based semiconductor layer highly lattice-matched with the Group III nitride semiconductor thin-film layer can be formed. Therefore, a pn-junction compound semiconductor light-emitting diode exhibiting no local breakdown can be provided.

BEST MODE FOR CARRYING OUT THE INVENTION

Figure 1:
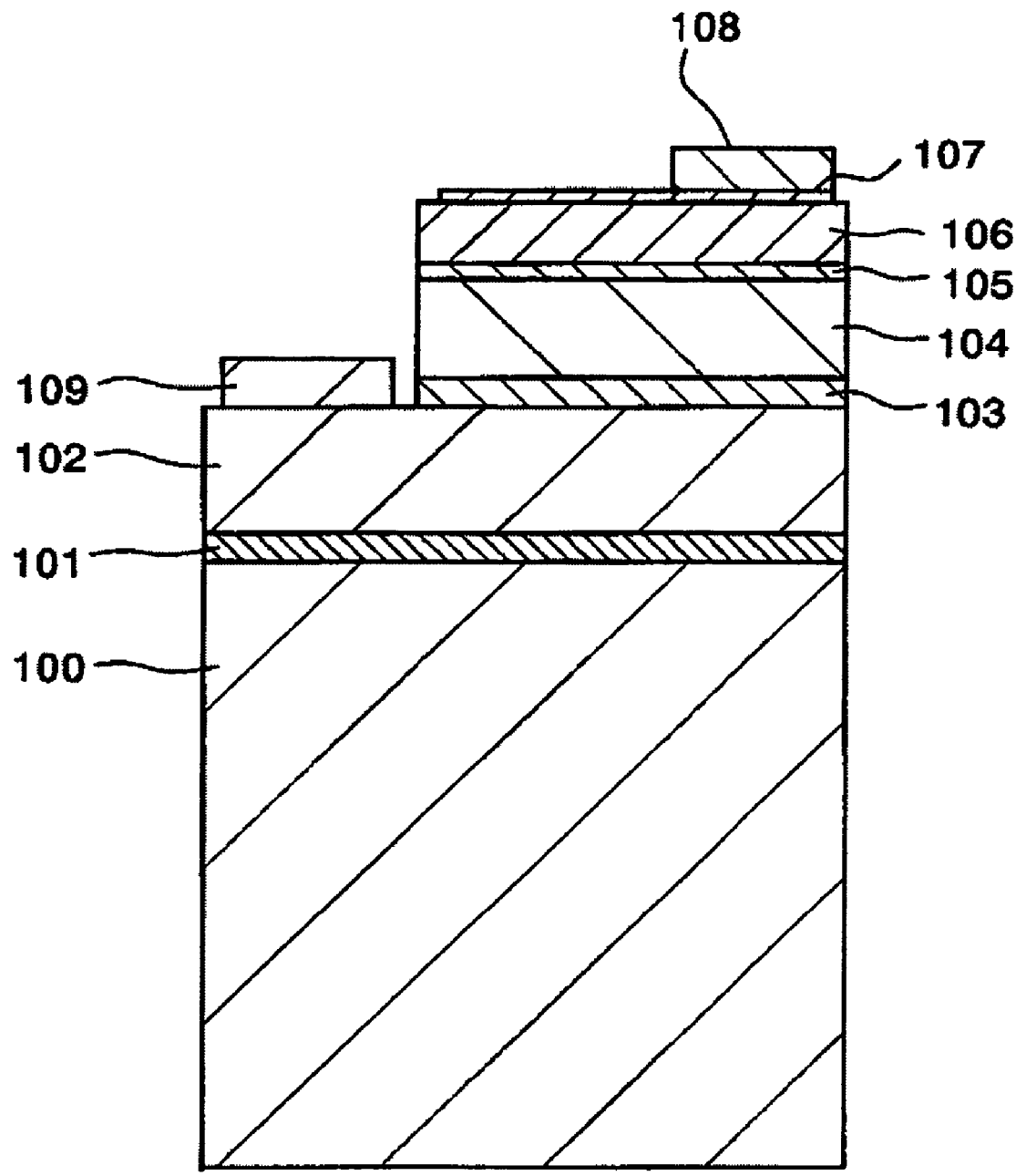
FIG. 1 is a schematic cross-section of the LED according to a first embodiment of the present invention.

The boron-phosphide-based semiconductor employed in the present invention contains, as essential constituent elements, component boron (B) and phosphorus (P). Examples include $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$) and $B_\alpha Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0\leq\delta<1$). Among them, semiconductors having a few constituent elements and being readily formed are preferably employed in the present invention, and examples include boron monophosphide (BP); boron gallium indium phosphide (compositional formula: $B_\alpha Ga_\gamma In_{1-\alpha-\gamma}P$ ($0<\alpha\leq 1$, $0\leq\gamma<1$)); and mixed crystal compounds containing a plurality of Group V elements such as boron nitride phosphide (compositional formula: $BP_{1-\delta}N_\delta$ ($0\leq\delta<1$)) and boron arsenide phosphide (compositional formula: $B_\alpha P_{1-\delta}As_\delta$).

The boron-phosphide-based semiconductor layer is formed through a vapor phase growth means such as the halogen method, the hydride method, or MOCVD (metal-organic chemical vapor deposition). Molecular-beam epitaxy may also be employed (see J. Solid State Chem., 133(1997), p. 269-272). For example, a p-type boron monophosphide (BP) layer may be formed through atmospheric-pressure (near atmospheric pressure) or reduced-pressure MOCVD making use of triethylborane (molecular formula: $(C_2H_5)_3B$) and phosphine (molecular formula: $PH_3$) as sources. The p-type BP layer is preferably formed at 1,000° C. to 1,200° C. When a p-type boron phosphide layer is formed in an undoped state (i.e., no impurity element is added), the source supply ratio (V/III concentration ratio; e.g., $PH_3/(C_2H_5)_3B$) is preferably 10 to 50.

The p-type boron-phosphide-based semiconductor layer of the present invention is formed from a Group III nitride semiconductor material for forming a light-emitting layer and a material having a bandgap wider than that of a Group III-V compound semiconductor material. For example, when a blue-light-emitting layer composed of a Group III nitride semiconductor having a bandgap of 2.7 eV at room temperature is employed, a boron-phosphide-based semiconductor layer having a bandgap of 2.8 eV to 5.0 eV at room temperature is employed. The sufficient difference in bandgap between the p-type boron-phosphide-based semiconductor layer and a light-emitting layer composed of a single crystal layer or a well layer of a light-emitting layer having a quantum well structure is 0.1 eV or more. When the difference is 0.1 eV or more, the light emitted from the light-emitting layer is sufficiently transmitted to the outside. The bandgap may be determined on the basis of photon energy ($=h\cdot\nu$) dependence of absorbance or on the basis of photon energy dependence of a product ($=2\cdot n\cdot k$) of refractive index (n) and extinction coefficient (k).

Through precise control of growth rate in addition to formation temperature and V/III ratio, there can be formed a p-type boron-phosphide-based semiconductor layer which exhibits a wide bandgap. When the growth rate during MOCVD is controlled to a range of 2 nm/min to 30 nm/min, a boron monophosphide layer which exhibits a bandgap of 2.8 eV or more at room temperature can be produced (see Japanese Patent Application No. 2001-158282). Particularly, a boron-phosphide-based semiconductor layer having a bandgap of 2.8 eV to 5.0 eV at room temperature is preferably employed as a contact layer also serving as a window layer through which emitted light is transmitted.

Although the p-type boron-phosphide-based semiconductor layer of the present invention may be formed from a p-type layer intentionally doped with beryllium (symbol of element: Be) rather than Mg, the p-type boron-phosphide-based semiconductor layer is preferably undoped. For example, a low-resistive boron monophosphide (BP) layer having a hole concentration higher than $10^{19}$ cm$^{-3}$ in an undoped state is preferably employed. Since the undoped boron-phosphide-based semiconductor contains no p-type impurity element added thereto, diffusion of impurities to a p-type Group III nitride semiconductor layer or a light-emitting layer disposed under the boron-phosphide-based semiconductor layer is reduced. Therefore, there can be prevented problematic change in carrier concentration of the light-emitting layer and, further, in conduction type caused by diffusion of the p-type impurity element added to the boron-phosphide-based semiconductor layer, which would result in deviation of forward voltage (Vf) from a desired value or deviation of emission wavelength from a predetermined value.

The p-type boron-phosphide-based semiconductor layer of the present invention is provided on the light-emitting layer by the mediation of a thin-film layer composed of an n-type or a p-type Group III nitride semiconductor and formed on, for example, a p-type Group III nitride semiconductor layer serving as a cladding layer. When the thin-film layer is formed from a Group III nitride semiconductor having a bandgap wider than that of the Group III nitride semiconductor forming the light-emitting layer, light emitted from the light-emitting layer is advantageously extracted to the outside.

The Group III nitride semiconductor thin-film layer may be formed with doping with, for example, silicon (symbol of element: Si) or germanium (symbol of element: Ge) as well as a Group II element such as beryllium (Be). However, an undoped thin-film layer which contains no n-type or p-type impurity element for determining conduction type is preferred. The Group III nitride semiconductor thin-film layer preferably has a thickness of 20 nm or less so that the tunnel effect is fully attained. From another aspect, the Group III nitride semiconductor thin-film layer preferably has a thickness of 1 nm or more. In order to completely cover the entire surface of a p-type cladding layer composed of, for example, aluminum gallium nitride (Al$_X$Ga$_Y$N: 0≦X, Y≦1, X+Y=1) serving as a base layer, the thin-film layer is required to have a thickness of 1 nm or more.

The Group III nitride semiconductor thin-film layer can prevent diffusion of the p-type impurity element added to a p-type Group III nitride semiconductor layer to a p-type boron-phosphide-based semiconductor layer. For example, the Group III nitride semiconductor thin-film layer effectively prevents migration of a large amount of Mg (dopant) added to the p-type gallium nitride (GaN) cladding layer into a boron-phosphide-based semiconductor layer. Thus, a boron-phosphide-based semiconductor layer exhibiting p-conduction type can be reliably formed by the mediation of a Group III nitride semiconductor thin-film layer. In particular, a Group III nitride semiconductor thin-film layer having a Mg (generally employed for forming a p-type Group III nitride semiconductor layer) concentration of 5×10$^{18}$ cm$^{-3}$ or less at the surface of the thin-film is effective for reliably forming a boron-phosphide-based semiconductor layer exhibiting p-conduction type thereon. The p-type impurity element concentration on the surface or inside the Group III nitride semiconductor layer may be determined through secondary ion mass spectrometry (abbreviated as SIMS) or Auger electron spectrometry.

In general, a p-type boron-phosphide-based semiconductor layer having high crystallinity can be formed on a light-emitting layer grown at a comparatively low temperature (700° C. to 800° C.) by the mediation of a base layer composed of a p-type Group III nitride semiconductor layer grown at a higher temperature. For example, a surface of a hexagonal wurtzite (0001)-Group III nitride semiconductor layer which has been grown at a high temperature of 1,000° C. to 1,200° C. is advantageous for growing thereon a p-type boron-phosphide-based semiconductor layer having a (111) crystal plane in which the [110] direction is aligned with the a-axis of the hexagonal bottom crystal lattice and attaining excellent lattice matching. In particular, on the (0001) surface of an aluminum gallium nitride (Al$_X$Ga$_Y$N: 0≦X, Y≦1, X+Y=1) layer, a high-quality p-type (111) boron-phosphide-based semiconductor layer having few misfit dislocations can be formed by virtue of excellent matching in terms of inter-lattice spacing. Crystal orientation of the thus-grown p-type boron-phosphide-based semiconductor layer may be analyzed through X-ray diffraction means or electron diffraction means.

Particularly, a Group III nitride semiconductor thin-film layer composed of Al$_X$Ga$_Y$N (0<X, Y<1, X+Y=1) containing aluminum (symbol of element: Al) as a constituent element tends to attain more excellent surface flatness as compared with a Group III nitride semiconductor thin-film layer containing indium (symbol of element: In). For example, a Group III nitride semiconductor thin-film layer composed of Al$_X$Ga$_Y$N (0<X, Y<1, X+Y=1) and having a flat and smooth surface (i.e., surface roughness (rms) of 0.5 nm or less) can be reliably formed. Thus, a p-type, lower-resistive (111) boron-phosphide-based semiconductor layer is advantageously formed reliably. For example, on the (0001) surface of an Al$_{0.1}$Ga$_{0.9}$N layer (aluminum (Al) compositional proportion (X): 0.1) having a surface roughness of 0.3 nm (rms), a low-resistive p-type boron-phosphide-based semiconductor layer having a resistivity of 5×10$^{-2}$ Ω·cm can be reliably formed.

The pn-junction compound semiconductor light-emitting device of the present invention is fabricated by providing a p-type Ohmic electrode (positive electrode) on the aforementioned low-resistive p-type boron-phosphide-based semiconductor layer. On the p-type boron-phosphide-based semiconductor layer, the p-type Ohmic electrode may be formed from nickel (Ni) (symbol of element: Ni)(see DE (West Germany) Patent No. 1162486), nickel alloy, gold (symbol of element: Au)-zinc (Zn) alloy, gold (Au)-beryllium (Be) alloy, or the like. When the Ohmic electrode having a multi-layer structure is formed, the uppermost layer is preferably formed of gold (Au) or aluminum (Al) in order to facilitate bonding. In the case where the Ohmic electrode having a tri-layer structure is formed, an intermediate layer provided between the bottom portion and the uppermost layer may be formed of a transition metal (e.g., titanium (symbol of element: Ti) or molybdenum (symbol of element: Mo)) or platinum (symbol of element: Pt). Meanwhile, an n-type Ohmic electrode (negative electrode) may be provided on the n-type substrate or an n-type layer formed on the substrate.

(Effects)

The Group III nitride semiconductor thin-film layer serving as a base layer for forming a p-type boron-phosphide-based semiconductor layer thereon can reliably provide a low-resistive p-type boron-phosphide-based semiconductor layer.

Particularly, a Group III nitride semiconductor thin-film layer composed of $Al_XGa_YN$ ($0<X\leq1$, $0\leq Y<1$, $X+Y=1$) containing aluminum (symbol of element: Al) as an essential constituent element and having high surface flatness and smoothness can reliably provide a low-resistive p-type boron-phosphide-based semiconductor layer, which is advantageous for providing a p-type Ohmic electrode.

EXAMPLES

Example 1

The present invention will next be described in detail taking, as an example, fabrication of a pn-junction compound semiconductor LED having a p-type boron-phosphide-based semiconductor layer joined to an undoped Group III nitride semiconductor layer.

Figure 2:
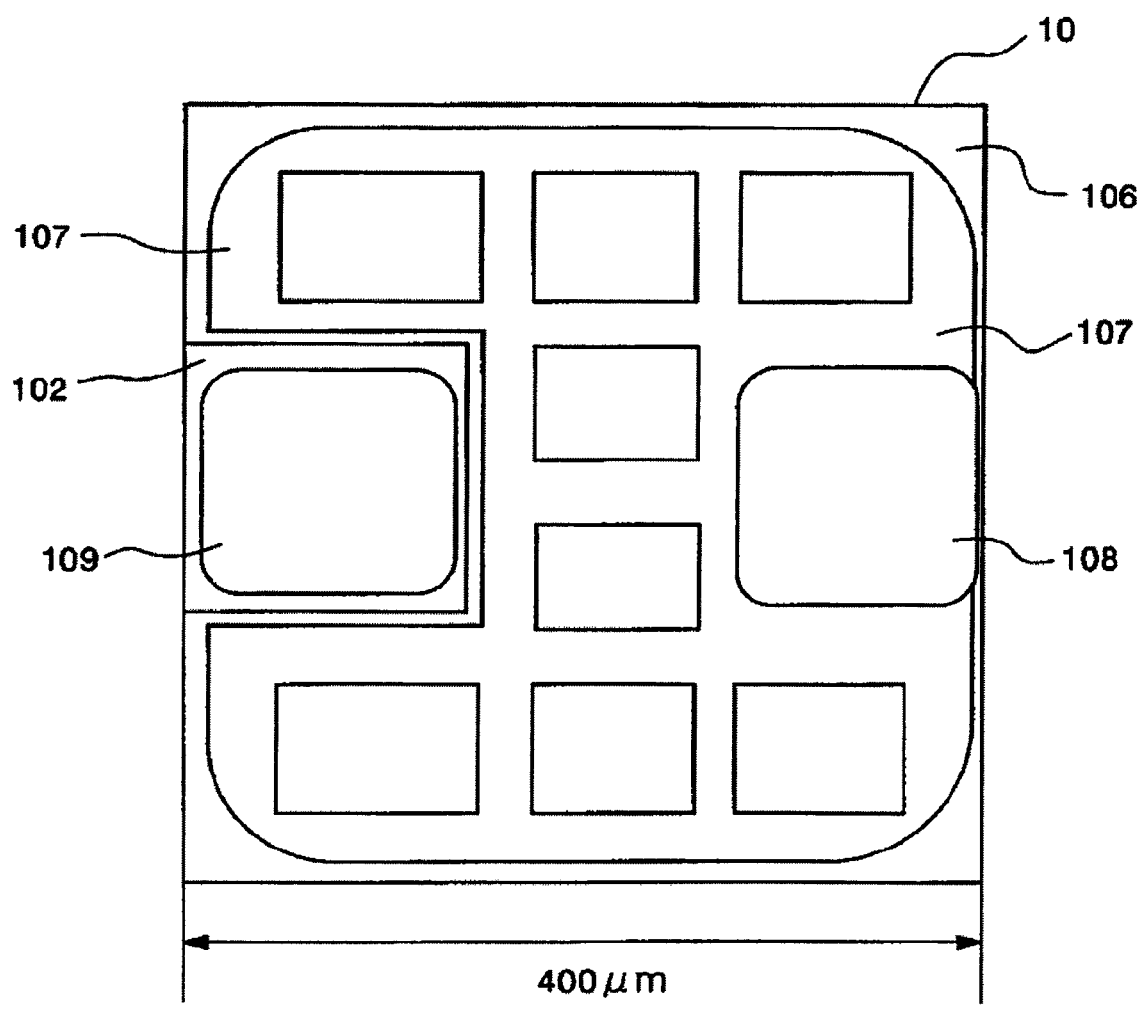
FIG. 2 is a schematic cross-section of the LED according to a second embodiment of the present invention.

FIG. 1 schematically shows a cross-section of an LED 10 having a double-hetero (DH) junction structure. FIG. 2 is a schematic plan view of the LED 10.

The LED 10 was fabricated from a stacked structure formed of the following layers (1) to (6) sequentially grown on a (0001)-sapphire (α-$Al_2O_3$ single crystal) substrate 100.

(1) a buffer layer 101 (thickness (t): 15 nm) composed of undoped GaN
(2) a lower cladding layer 102 composed of a silicon (Si)-doped n-type GaN layer (carrier concentration (n)=$7\times10^{18}$ cm$^{-3}$, t=3 μm)
(3) a light-emitting layer 103 having a well layer composed of an undoped n-type $Ga_{0.86}In_{0.4}N$ layer
(4) an upper cladding layer 104 composed of a magnesium (Mg)-doped p-type $Al_{0.15}Ga_{0.85}N$ layer (carrier concentration (p)=$4\times10^{17}$ cm$^{-3}$, t=9 nm)
(5) a Group III nitride semiconductor thin-film layer 105 composed of an undoped n-type $Al_{0.10}Ga_{0.90}N$ layer (n=$7\times10^{16}$ cm$^{-3}$, t=8 nm)
(6) a p-type boron-phosphide-based semiconductor layer 106 composed of undoped p-type boron phosphide (BP) (carrier concentration (p)=$2\times10^{19}$ cm$^{-3}$, t=350 nm)

The light-emitting layer 103 had a multiple quantum well structure including Si-doped n-type GaN layers (t=12 nm) serving as barrier layers. The multiple quantum well structure of the light-emitting layer 103 includes five stacking cycles in which each of the layer joined to the n-type lower cladding layer 102 and the layer joined to the p-type upper cladding layer 104 serves as a well layer. The light-emitting layer 103 was grown at 750° C. The upper cladding layer 104 composed of a p-type $Al_{0.15}Ga_{0.85}N$ layer was grown at 1,100° C., which was higher than the temperature (750° C.) at which the well layers and the barrier layers forming the light-emitting layer 103 had been formed.

Through conventional secondary ion mass spectrometry (SIMS), magnesium (Mg) atom concentration inside the Group III nitride semiconductor thin film layer 105 composed of an undoped $Al_{0.10}Ga_{0.9}N$ layer was determined. The results indicated that the magnesium (Mg) atom concentration decreased from the junction interface between the $Al_{0.10}Ga_{0.90}N$ layer and the Mg-doped p-type $Al_{0.15}Ga_{0.85}N$ upper cladding layer 104 toward the upper surface of the Group III nitride semiconductor layer 105. The Mg concentration at the upper surface of the layer 105 was found to be $4\times10^{17}$ cm$^{-3}$.

The undoped p-type boron phosphide (BP) layer 106 was formed on the Group III nitride semiconductor thin-film layer 105 through an atmospheric-pressure (near atmospheric pressure) metal-organic chemical vapor deposition (MOCVD) means making use of triethylborane (molecular formula: $(C_2H_5)_3B$) as a boron (B) source and phosphine (molecular formula: $PH_3$) as a phosphorus (P) source. The p-type boron phosphide (BP) layer 106 was formed at 1,050° C. The V/III ratio (=$PH_3/(C_2H_5)_3B$ concentration ratio) during the vapor growth of the p-type boron phosphide layer 106 was adjusted to 15. The thickness of the p-type boron phosphide layer 106 grown at a growth rate of 25 nm/min was adjusted to 350 nm.

The refractive index and extinction coefficient of the p-type boron phosphide layer 106 were determined by use of a conventional ellipsometer, and the bandgap of the p-type boron phosphide layer 106, as calculated from the determined refractive index and extinction coefficient, was about 3.1 eV at room temperature. The undoped p-type boron phosphide layer 106 was found to have an acceptor concentration, as determined through a conventional electrolytic C-V (capacitance-voltage) method, of $2\times10^{19}$ cm$^{-3}$.

The stacking feature of the Group III nitride semiconductor layer 105 composed of an undoped $Al_{0.10}Ga_{0.90}N$ layer and the p-type boron phosphide 106 was investigated on the basis of a selected area electron diffraction (abbreviated as SAD) pattern captured by a conventional transmission electron microscope (abbreviated as TEM). Analysis of the SAD pattern revealed that the $Al_{0.10}Ga_{0.90}N$ Group III nitride semiconductor layer 105 was a hexagonal crystal layer and that the p-type boron phosphide 106 was a cubic crystal layer. Diffraction spots obtained from the (0001) plane of the $Al_{0.10}Ga_{0.90}N$ layer 105 and those obtained from the (111) plane of the p-type boron phosphide layer 106 appeared in the same line. The results indicated that the p-type boron phosphide layer 106 was stacked on the (0001) plane of the $Al_{0.10}Ga_{0.90}N$ Group III nitride semiconductor layer 105 such that the (0001) plane and the (111) crystal plane of the p-type boron phosphide layer 106 were aligned in the same direction.

On the surface of the p-type boron phosphide layer 106, a p-type Ohmic electrode 107 was provided through conventional vacuum evaporation and electron-beam evaporation, the Ohmic electrode 107 being composed of an electrode (lattice-shape electrode) in which a stacked gold (Au) film and nickel (Ni) oxide film were arranged in a lattice-like pattern (see FIG. 2). On the p-type Ohmic electrode 107 at a peripheral portion of the p-type boron phosphide layer 106, a bonding pad electrode 108 composed of gold (Au) film was provided so as to be in contact with the p-type Ohmic contact electrode. Meanwhile, an n-type Ohmic electrode 109 also serving as a pad electrode was provided on a surface of the lower cladding layer 102 composed of an n-type GaN layer, the surface being exposed through selectively etching by means of conventional plasma etching. Subsequently, the stacked structure 11 was cut into square (400 μm×400 μm) LED chips 10.

Emission characteristics of the LED chips 10 were evaluated when forward operation current (20 mA) was flown between the p-type Ohmic electrode 107 and the n-type Ohmic electrode 109. The LED chips 10 were found to emit blue light having a center wavelength of 460 nm. The emission output of each chip before resin-molding, as determined through a typical integrating sphere, was as high as 5 mW.

Since the p-type Ohmic electrode 107 was formed on the low-resistive boron phosphide layer 106 provided on the undoped Group III nitride semiconductor layer 105, the Ohmic electrode exhibited low contact resistance with a forward voltage (Vf) of 3.5 V. The reverse voltage at a reverse current of 10 μA was found to be higher than 10 V, indicating that an LED 10 exhibiting excellent reverse breakdown voltage was provided. Particularly, since the p-type boron-phosphide-based semiconductor layer 106 for providing a p-type Ohmic electrode 107 thereon was formed from a (111) crystal layer formed on a hexagonal (0001) crystal plane and attaining high lattice matching, the LED 10 exhibiting little local breakdown was provided.

Example 2

The present invention will next be described in detail taking, as an example, fabrication of a pn-junction compound semiconductor LED having a p-type boron aluminum phosphide layer joined to an undoped Group III nitride semiconductor layer.

On the sapphire substrate described in Example 1, the same constituent layers as employed in Example 1; i.e., a buffer layer, an n-type lower cladding layer, a light-emitting layer, a p-type upper cladding layer, and an undoped $Al_{0.10}Ga_{0.90}N$ layer were formed. Subsequently, an undoped p-type boron aluminum phosphide (compositional formula: $B_{0.98}Al_{0.02}P$) layer was provided so as to be joined to the Group III nitride semiconductor layer composed of the undoped $Al_{0.10}Ga_{0.90}N$ layer. The $B_{0.98}Al_{0.02}P$ layer serving as the p-type boron-phosphide-based semiconductor layer was formed so as to have a carrier concentration of about $7\times10^{17}$ cm$^{-3}$ and a thickness of 200 nm.

Through analysis of electron diffraction patterns, all of the n-type lower cladding layer, light-emitting layer, p-type upper cladding layer, and undoped $Al_{0.10}Ga_{0.90}N$ layer were found to be hexagonal crystal layers. Each layer was found to have a (0001) crystal orientation. On the basis of relative positions of the appeared electron diffraction spots, the undoped $B_{0.98}Al_{0.02}P$ layer was found to be a cubic (111) crystal layer of which <110> direction was aligned in the direction identical to the a-axis of the (0001) crystal plane of the $Al_{0.10}Ga_{0.90}N$ layer.

In Example 2, the p-type boron-phosphide-based semiconductor layer provided on the hexagonal Group III nitride semiconductor layer is formed from a p-type boron-phosphide-based semiconductor material ($B_{0.98}Al_{0.02}P$) containing aluminum (Al) as a constituent element. Therefore, a low-resistive p-type boron-phosphide-based semiconductor layer having excellent surface flatness was provided.

Emission characteristics of the LED chips were evaluated when forward operation current (20 mA) was caused to flow between the p-type Ohmic electrode and the n-type Ohmic electrode which were formed in a manner similar to that of Example 1. The LED chips were found to emit blue light having a center wavelength of 460 nm. Similar to Example 1, since the p-type boron-phosphide-based semiconductor layer was formed from an undoped layer, the amount of p-type impurity element diffusing from the p-type boron-phosphide-based semiconductor layer to the light-emitting layer or other layers was reduced. Thus, even though the p-type boron-phosphide-based semiconductor layer was formed from a semiconductor material differing from that of Example 1, emission wavelength of the LEDs was not changed. The emission output of each chip before resin-molding, as determined through a typical integrating sphere, was 5 mW.

Since the undoped boron-phosphide-based semiconductor layer containing aluminum (Al) as a constituent element (i.e., $B_{0.98}Al_{0.02}P$ layer) and having high surface flatness was employed, a p-type Ohmic electrode exhibiting low contact resistance was formed. The forward voltage (Vf) was as low as 3.4 V. In contrast, the reverse voltage at a reverse current of 10 μA was found to be higher than 15 V, indicating that an LED exhibiting remarkably excellent reverse breakdown voltage was provided.

INDUSTRIAL APPLICABILITY

According to the present invention, problematic failure to reliably form the p-type boron-phosphide-based semiconductor layer caused by thermal diffusion of the p-type impurity element added to the p-type Group III nitride semiconductor layer can be prevented, whereby a low-resistive p-type boron-phosphide-based semiconductor layer suitable for forming a p-type Ohmic electrode can be reliably formed. Therefore, a pn-junction compound semiconductor light-emitting diode exhibiting low forward voltage can be provided.

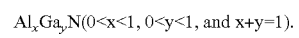

The invention claimed is:

1. A pn-junction compound semiconductor light-emitting device comprising:
    a crystal substrate;
    a light-emitting part comprising an n-type lower cladding layer, an n-type light emitting layer, and a doped p-type Group III nitride semiconductor upper cladding layer, sequentially formed on the crystal substrate;
    an undoped Group III nitride thin film semiconductor layer, to which no p-type or n-type impurity element has been added thereto, formed on the p-type upper cladding layer; and
    an undoped p-type boron-phosphide based semiconductor layer having a sphalerite crystal type, sequentially formed on the undoped Group III nitride thin film semiconductor layer,
    wherein the undoped Group III nitride thin film semiconductor layer is formed of a hexagonal Group III nitride semiconductor,
    the undoped p-type boron-phosphide based semiconductor layer having a sphalerite crystal type is formed on a surface of the undoped Group III nitride thin film semiconductor layer, and
    wherein the undoped Group III nitride thin film semiconductor layer has a surface of a (0001) crystal plane, and the undoped p-type boron-phosphide based semiconductor layer formed on the surface of the (0001) crystal plane is a (111) crystal layer having a [110] direction aligned with an a-axis of the (0001) crystal plane.

2. A pn-junction compound semiconductor light-emitting device according to claim 1,
    wherein the doped p-type Group III nitride semiconductor upper cladding layer is formed from a wurtzite aluminum gallium nitride layer containing aluminum as an essential constituent element and having a composition represented by a compositional formula:

$Al_xGa_yN(0<x<1, 0<y<1, $ and $x+y=1)$.